United States Patent
McQuilkin (10) Patent No.: US 9,813,050 B1
(45) Date of Patent: Nov. 7, 2017

(54) COMPARATOR CIRCUIT WITH INPUT ATTENUATOR

(71) Applicant: Analog Devices, Inc., Norwood, MA (US)

(72) Inventor: Christopher C. McQuilkin, Hollis, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/097,954

(22) Filed: Apr. 13, 2016

(51) Int. Cl.
*H03K 5/24* (2006.01)

(52) U.S. Cl.
CPC ............ *H03K 5/2418* (2013.01); *H03K 5/24* (2013.01); *H03K 5/2409* (2013.01)

(58) Field of Classification Search
CPC ....... H03K 5/2409; H03K 5/2418; H03K 5/24
See application file for complete search history.

(56) References Cited

U.S. PATENT DOCUMENTS

| | | | | |
|---|---|---|---|---|
| 3,628,059 A * | 12/1971 | Niu | ...................... | H03K 3/2897 327/72 |
| 4,523,312 A * | 6/1985 | Takeuchi | ............. | G01R 31/316 714/700 |
| 4,623,799 A * | 11/1986 | Nyman, Jr. | .... | H03K 19/017581 324/73.1 |
| 4,636,716 A * | 1/1987 | Welzhofer | ........... | G01R 31/316 324/537 |
| 4,675,551 A * | 6/1987 | Stevenson | ............ | H03K 19/088 326/30 |
| 5,200,696 A * | 4/1993 | Menis | .............. | G01R 31/31924 324/73.1 |
| 5,287,022 A * | 2/1994 | Wilsher | ........... | G01R 31/31924 326/62 |
| 5,640,127 A * | 6/1997 | Metz | ........................ | H03F 1/52 327/309 |
| 6,121,798 A * | 9/2000 | McQuilkin | ............ | H03K 3/287 327/55 |
| 6,292,342 B1 * | 9/2001 | Miyamoto | ............... | G01R 1/36 324/762.01 |
| 6,639,397 B2 * | 10/2003 | Roth | ................ | G01R 31/31924 324/537 |
| 6,774,680 B2 * | 8/2004 | Imagawa | ............ | H03F 3/45152 327/56 |
| 7,389,190 B2 * | 6/2008 | Umemura | .......... | G01R 31/3191 702/64 |

(Continued)

*Primary Examiner* — Thomas J Hiltunen
(74) *Attorney, Agent, or Firm* — Schwegman Lundberg & Woessner, P.A.

(57) ABSTRACT

A comparator circuit's signal range can be enhanced using an input signal attenuation circuit. In an example, a comparator circuit receives an input signal and a reference signal. The input signal can be conditioned by one or both of the attenuation circuit and a conditioning circuit, and a resulting conditioned signal can be presented to a compare element. Under first operating conditions where the input signal is approximately equal to the reference signal, the attenuation circuit can be substantially bypassed and a first resulting conditioned signal can be presented to the compare element. Under second operating conditions where the input signal is substantially greater than the reference signal, the attenuation circuit receives a portion of the input signal and a different second resulting conditioned signal can be presented to the compare element.

20 Claims, 6 Drawing Sheets

(56) References Cited

U.S. PATENT DOCUMENTS

| | | | |
|---|---|---|---|
| 7,489,146 B2* | 2/2009 | Balke | G01R 31/31924 324/713 |
| 7,535,262 B2* | 5/2009 | Abdoulin | H02M 1/08 327/333 |
| 7,863,921 B2* | 1/2011 | Sonnhueter | G01R 31/31926 324/762.02 |
| 8,183,893 B2* | 5/2012 | Kojima | H04L 25/028 327/108 |
| 8,258,868 B2* | 9/2012 | Marshall | H03K 5/24 330/253 |
| 2003/0165037 A1* | 9/2003 | Liscinksy | H02H 3/253 361/78 |

* cited by examiner

COMPARATOR CIRCUIT WITH INPUT ATTENUATOR

BACKGROUND

A test system for electronic device testing can include a pin driver circuit that provides a voltage test pulse to a device under test (DUT). In response, the test system can be configured to measure a response from a DUT, such as to determine whether the DUT meets one or more specified operating parameters. A test system can optionally include multiple driver circuits, such as a class AB driver circuit and a class A driver circuit to provide circuit test signals having different amplitude or timing characteristics. In an example, the test system is configured to measure a response from a DUT using an active load and a comparator circuit to sense transitions at a DUT pin.

Various comparator circuit structures have been proposed. Some have enhanced latching accuracy or enhanced bandwidth capabilities for operations such as high-speed sampling in applications such as analog-to-digital converters or automatic test equipment. In an example, a comparator circuit includes an AC input node, a DC input node, and an output node. In an example that includes a comparator in a circuit configured to execute automated testing of a DUT, the AC input node can be coupled to a DUT interface node, and the DC input node can be coupled to a reference voltage signal. Signal changes at the output node of the comparator circuit can indicate a relationship between the DUT output and the reference voltage signal.

Automatic test equipment can be qualified to perform various tests according to, among other things, propagation delay characteristics associated with a comparator circuit in the ATE. A propagation delay characteristic of the comparator circuit can depend in part on characteristics of the signals received from the DUT via the DUT interface node. For example, changes in any one or more of the slew rate, rise time, overdrive status, polarity, or duty cycle at the AC input node can influence a propagation delay characteristic of the comparator circuit.

OVERVIEW

The present inventor has recognized, among other things, that a problem to be solved includes providing a comparator circuit with a substantially constant signal propagation delay characteristic, and that is insensitive to changes in input signal characteristics such as slew rate, rise time, overdrive status, polarity, or duty cycle. A further problem to be solved includes maximizing a voltage range or bandwidth of a comparator circuit.

In an example, a solution to the propagation delay problem includes a comparator circuit that uses a conditioner circuit and an attenuation circuit to selectively process input signals and present a portion of an input signal at a compare element in the comparator circuit. In an example, the solution includes using a conditioning circuit, such as a bridge circuit, between an input node of the comparator circuit and an input of the compare element in the circuit. The solution further includes using the attenuation circuit to help reduce reverse voltage stresses imposed on the bridge circuit, such as from large magnitude input signal swings at the comparator circuit's input node. Comparator circuits described herein can be configured to provide an output signal with a propagation delay that is substantially constant in response to reference signal changes (e.g., changes in a DC signal common mode voltage signal at the comparator circuit's reference node) and in response to input signal changes (e.g., changes in an AC signal slew rate, an AC signal rise time, an AC signal overdrive status, an AC signal polarity, or an AC signal duty cycle or frequency at the comparator circuit's input node).

In an example, a solution to the above-described problems includes a system comprising an input node configured to receive an input signal, a reference node configured to receive a reference signal, and a comparator circuit, including first and second comparator inputs and a comparator output, wherein the second comparator input is coupled to the reference node. In this example, the solution includes or uses a conditioning circuit coupled to the input node and to the first comparator input. The conditioning circuit can be configured to pass the input signal from the input node to the first comparator input when a magnitude of the input signal is substantially the same as a magnitude of the reference signal, and can be further configured to pass an attenuated portion of the input signal from the input node to the first comparator input when the magnitude of the input signal is substantially different than the magnitude of the reference signal. In this example, the solution further includes an attenuation circuit with a first signal path parallel to the conditioning circuit and between the input node and the first comparator input, and the first signal path includes a first signal attenuator that is configured to present an attenuated portion of the input signal to the first comparator input. The attenuation circuit can further include a second signal path that extends between the first and second comparator inputs, wherein the second signal path includes an electrical load to the conditioning circuit and to the first signal attenuator. In an example, the conditioning circuit includes a diode bridge circuit having a first side coupled to the input node and a second side coupled to the first comparator input. The first signal path of the attenuation circuit can shunt the diode bridge circuit, that is, provide an electrical conduction path that is parallel to the diode bridge circuit.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In an example, a pin driver circuit of a test system provides a voltage pulse stimulus to a device under test (DUT) at a specified time, and optionally measures a response from the DUT. The test system can be configured to provide high fidelity output signal pulses over a relatively large output signal magnitude range to accommodate different types of devices under test. In some examples, a test system includes a comparator circuit to process response information from the DUT.

Systems and methods described herein provide, among other things, a comparator circuit with an enhanced operating voltage range due in part to an attenuation circuit. As a result of the attenuation circuit, integrity of a bridge circuit included in the comparator circuit can be preserved by reducing reverse voltage stresses imposed by large voltage signal magnitude swings at the comparator circuit's input node. The comparator circuit can also have enhanced gain and bandwidth characteristics, for example, by being effectively transparent in a transition signal range. Some examples herein include or show various comparator circuits in the context of a test system or ATE, however, other uses are also contemplated.

Figure 1:
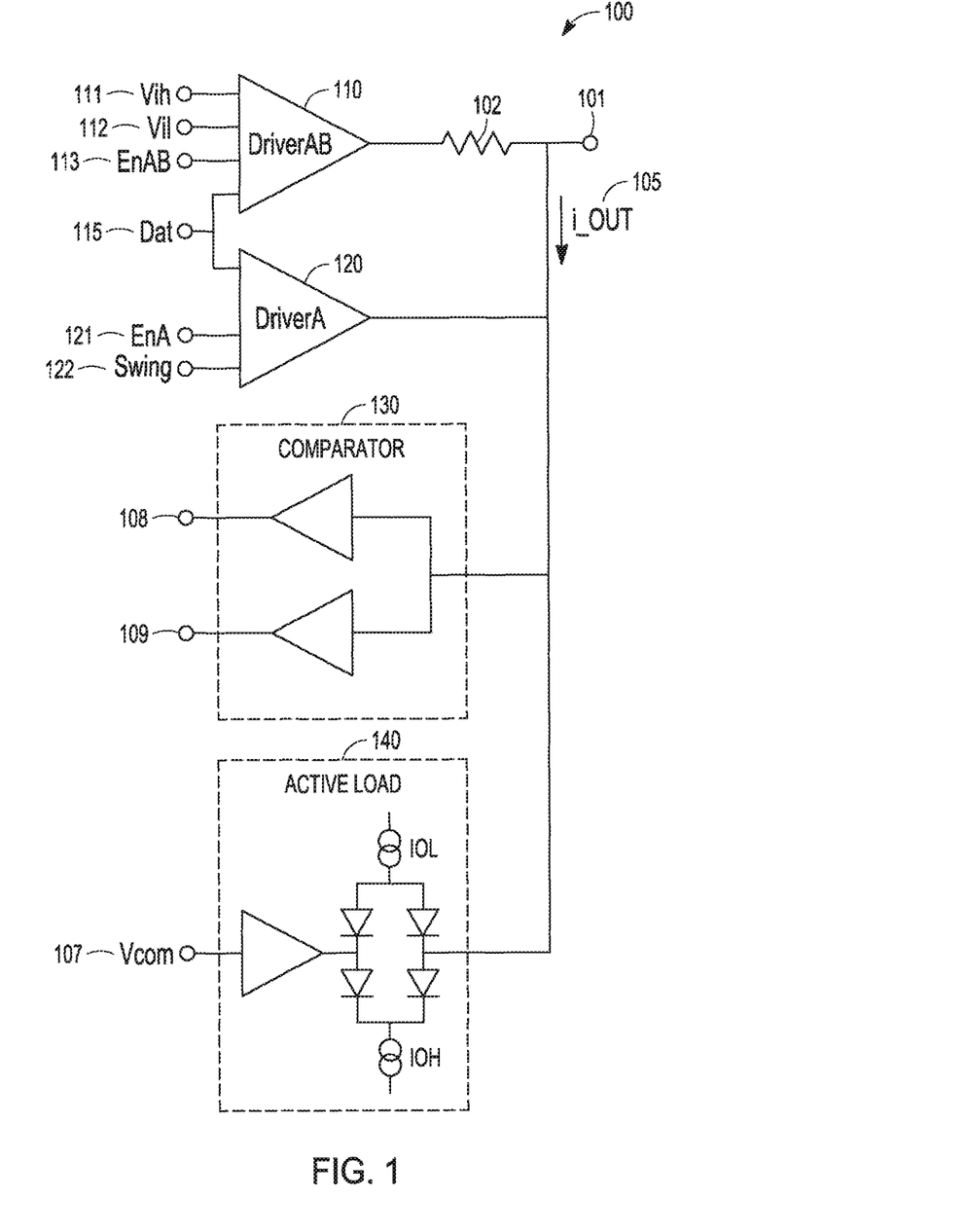
FIG. 1 illustrates generally an example of a test system topology including multiple driver circuits and a comparator circuit.

FIG. 1 illustrates generally an example 100 of a test system topology including multiple driver circuits and a comparator circuit. The example 100 includes a class AB driver circuit 110, a class A driver circuit 120, a comparator circuit 130, an active load 140, and a DUT pin 101. The example 100 further includes an output element 102 configured to provide a specified output or load impedance. The test system provides an output current 105, i_OUT. The comparator circuit 130, the active load 140, and the output element 102 can be configured to receive and interpret signals from the DUT.

In an example, the class AB driver circuit 110 is configured to produce a voltage stimulus signal by selecting between parallel connected diode bridges with each bridge driven by a unique, dedicated DC voltage level. In the example 100 of FIG. 1, DC voltages Vih 111 and Vil 112 drive diode bridges in the class AB driver circuit 110. The switching stage can be followed by a voltage buffering stage that can provide power gain, such as can be used to produce large currents to serve a 50 ohm DUT environment.

In contrast with the class AB driver stage, the class A driver circuit 120 is configured to produce voltage transitions at the DUT pin 101 using a relatively large current switch stage that is coupled directly to the DUT pin 101. The current switching stage in the class A driver circuit 120 alternately switches current into and out of the DUT pin 101 in response to a control signal Swing 122 (e.g., a voltage control signal). The class A driver circuit 120 can provide high speed operation since it isn't burdened by the class AB voltage buffering stage with its attendant bandwidth and other performance limitations.

In an example, the class A driver circuit 120 is configured to provide a relatively low amplitude signal at the DUT pin 101. For example, the class A driver circuit 120 can provide a signal having about a 2 volt swing. The class AB driver circuit 110 can be configured to provide a relatively high amplitude signal at the DUT pin 101, for example, −1.5 to +7 volts. The class A driver circuit 120 generally operates at a higher switching speed or bandwidth than the class AB driver circuit 110. In an example, the class AB driver circuit 110 is configured to absorb switching currents from the class A driver circuit 120. That is, the class AB driver circuit 110 can serve as a buffer that the class A driver circuit 120 can source current into, such as through the output element 102.

The class AB driver circuit 110 and the class A driver circuit 120 are selected to fulfill disparate DUT test requirements that may not otherwise be fulfilled by a single driver. For example, while both driver circuits can provide DUT waveforms, the class AB driver circuit 110 can be configured to provide large amplitude, low bandwidth stimulus signals, and the class A driver circuit 120 can be configured to provide low amplitude, high bandwidth stimulus signals.

In an example, the class AB driver circuit 110 and the class A driver circuit 120 do not share an enable pin. Instead, each driver circuit includes an independent enable control through pins EnAB 113 and EnA 121. The independent enable control facilitates the class AB driver circuit 110 to serve as a low speed, high voltage stimulus source, and to serve as a static, non-transitioning buffer to absorb switching currents from the class A driver circuit 120.

Figure 2:
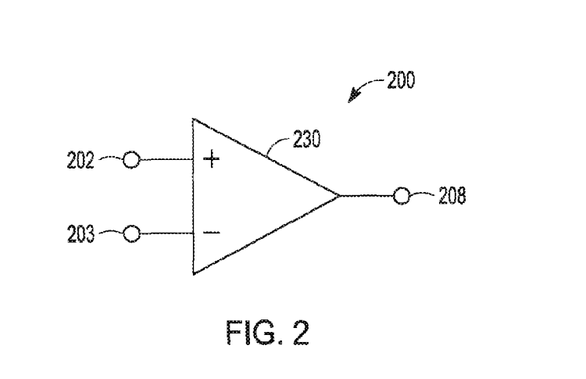
FIG. 2 illustrates generally a block diagram of a comparator circuit.

FIG. 2 illustrates generally a block diagram of a comparator circuit 230. In an example, the comparator circuit 230 forms a portion of the comparator circuit 130 from the example of FIG. 1. In FIG. 2, the comparator circuit 230 includes an AC input node 202, a DC input node 203, and a comparator output node 208. The AC input node 202 can be connected to the DUT pin 101 from the example of FIG. 1.

In an example, the AC input node 202 is configured to receive high frequency, wide bandwidth signal waveforms from the DUT pin 101. The DC input node 203 can be configured to receive relatively low frequency, low bandwidth signal information, such as a DC reference voltage signal. In operation, the comparator circuit 230 compares a first signal at the AC input node 202 to a second signal at the DC input node 203 and, in response, provides or presents an output signal at the comparator output node 208 that includes information about a relationship between the first and second signals.

Figure 3:
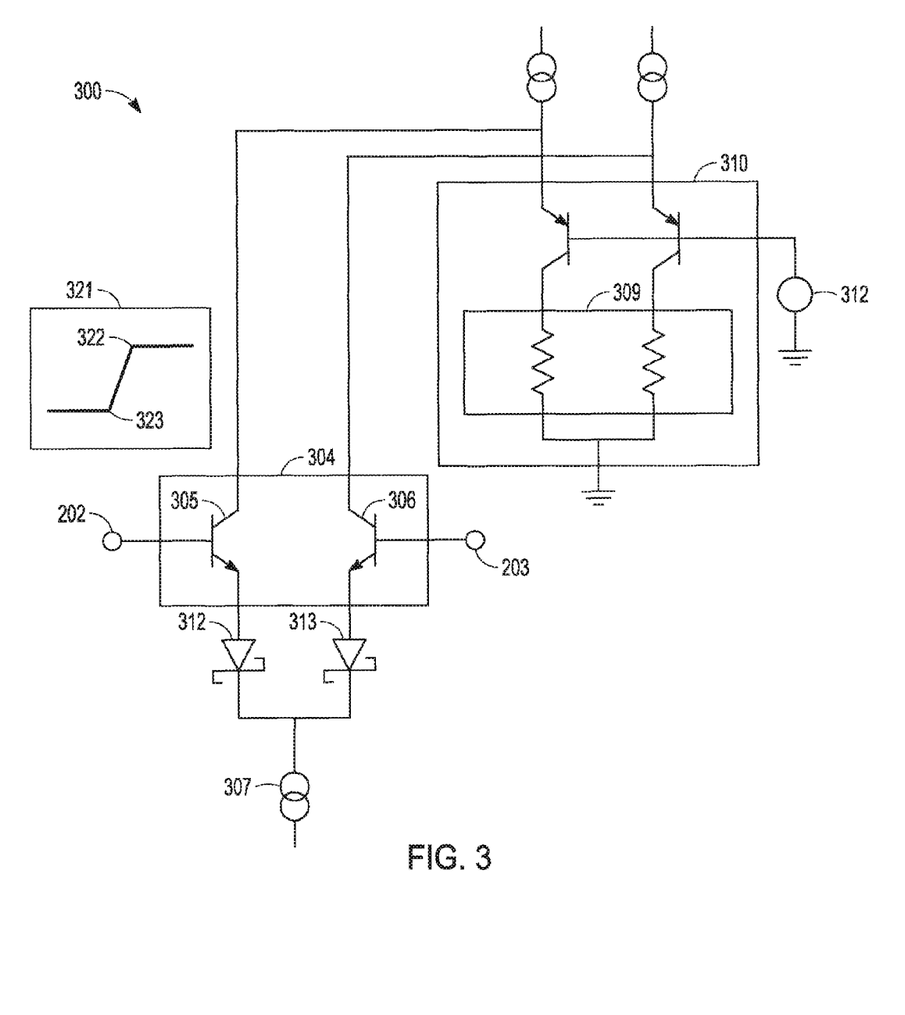
FIG. 3 illustrates generally an example of a first comparator circuit that can be susceptible to differential heating issues.

FIG. 3 illustrates generally an example of a first comparator circuit 300. The first comparator circuit 300 includes an AC input node 202 and a DC input node 203. In an example, the first comparator circuit 300 can receive a first high frequency DUT signal 321 such as having a specified maximum amplitude 322 and a specified minimum amplitude 323. The first comparator circuit 300 can include a first differential pair 304 of first and second transistors 305 and 306. In the example of FIG. 3, the first comparator circuit 300 includes a gain network 310 that includes gain-setting resistors 309, various switches, and a bias voltage signal source 312.

The first comparator circuit 300 can suffer from inconsistencies in signal propagation delay. For example, the first comparator circuit 300 can have a signal propagation delay characteristic that depends in part on AC or DC signal characteristics at the AC input node 202 and the DC input node 203, respectively. A propagation delay characteristic of the first comparator circuit 300 can depend on a rise time, slew rate, overdrive status, polarity, duty cycle, frequency, or other characteristic of a signal at the AC input node 202. In an example, a propagation delay characteristic of the first comparator circuit 300 can depend on a common mode voltage signal range at the DC input node 203.

The propagation delay dependence on an AC signal at the AC input node can be due, at least in part, to differential heating of the first and second transistors 305 and 306 in the first differential pair 304. Transistor heating, or power dissipation, can be based on a product of a transistor's collector current and collector-emitter voltage. In an example, when a base of the first transistor 305 is more positive than a base of the second transistor 306, a first collector current in the first transistor 305 can become larger than a second collector current in the second transistor 306. Thus, the first transistor 305 dissipates more power than the second transistor 306. When the first transistor 305 dissipates more power than the second transistor 306, the first transistor 305 becomes hotter than the second transistor 306. As a result of the heating, a base-emitter voltage change can occur, such as on the order of about 2 mV/C. Such a duty cycle-induced heating difference can be considered to be a time-dependent input offset, which in turn leads to a propagation delay characteristic change in the first comparator circuit 300.

A signal propagation delay characteristic of the first comparator circuit 300 can also change in response to changes in input signal swing amplitude or rise time. For example, the first differential pair 304 is configured to track full signal swings at the comparator circuit's inputs. A propagation delay resulting from a smaller amplitude, slower-rising pulse can be longer than a propagation delay resulting from larger amplitude, faster-rising pulse, for example, due to capacitive loading at the emitters of each of the first and second transistors 305 and 306. Such parasitic capacitive loading may not substantially affect or load the comparator circuit for smaller amplitude, slower-rising pulses. However, larger amplitude, faster-rising pulses produce capacitive effects that lead to spurious signal loading and artificially decrease propagation delay characteristics of the circuit.

The first comparator circuit 300 can be susceptible to heating problems, for example, when the bias voltage signal source 312 provides a signal level that approaches a maximum positive supply level. In an example, the bias voltage signal source 312 is configured to provide bias signals that meet or exceed a maximum positive excursion of an input common mode range at the AC input node 202 or the DC input node 203. When a bias signal amplitude from the bias voltage signal source 312 is at or near a maximum signal level, then the differential pair 304 has a large collector-emitter voltage and thus a high power level differential. A total heating magnitude can change in response to changes in the AC or DC common mode input signals, for example, since the collector-emitter voltages of each of the first and second transistors 305 and 306 can change with the common mode signal changes. One result of the heating is thus that a propagation delay characteristic of the first comparator circuit changes with common mode input signal changes.

In an example, a differential signal range of the first comparator circuit 300 can be limited by a breakdown characteristic of base-emitter junctions in one or more of the first and second transistors 305 and 306 of the first differential pair 304. In an example, the breakdown characteristic can be about 2 volts. To avoid such breakdown, Schottky diodes 312 and 313 can be used, however, the diodes 312 and 313 can reduce circuit gain and bandwidth characteristics.

Figure 4:
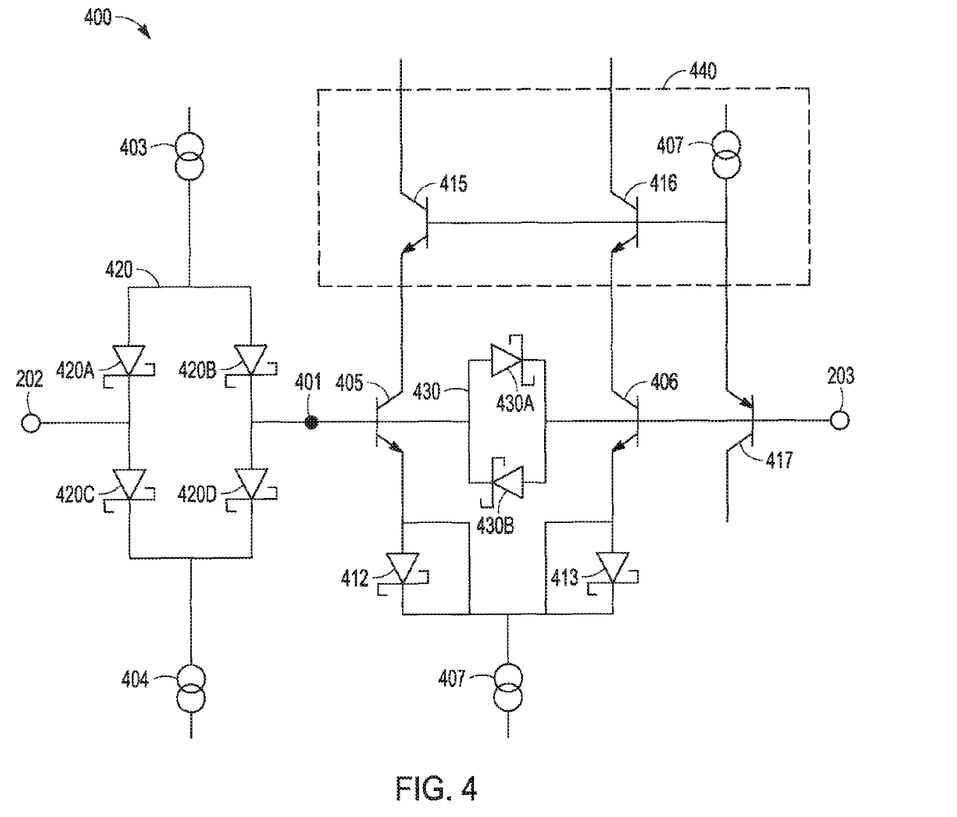
FIG. 4 illustrates generally an example of a second comparator circuit with a compare element clamp circuit.

FIG. 4 illustrates generally an example of a second comparator circuit 400. The second comparator circuit 400 has improved propagation delay characteristic performance relative to the first comparator circuit 300. Similarly to the example of the first comparator circuit 300, the second comparator circuit 400 includes the AC input node 202 and the DC input node 203, and a compare circuit that can include a differential pair of transistors including a first transistor 405 and a second transistor 406. The second comparator circuit 400 can be configured to compare a magnitude of a conditioned signal at a compare node 401 (e.g., corresponding to a base of the first transistor 405 of the differential pair) and a magnitude of the DC input node 203 (e.g., corresponding to a base of the second transistor 406 of the differential pair).

The second comparator circuit 400 can include Schottky diodes 412 and 413 at the emitters of the first and second transistors 405 and 406, respectively, to help avoid base-emitter junction breakdown. The second comparator circuit 400 further includes a clamp circuit 430 that couples the bases of the first and second transistors 405 and 406. The second comparator circuit 400 further includes a constraint circuit 440 that helps to minimize collector-emitter voltage differentials across the first and second transistors 405 and 406.

The second comparator circuit 400 includes other features that help to minimize propagation delay characteristic changes with respect to changes in AC and DC signal input changes. For example, the second comparator circuit 400 includes a first bridge circuit 420, the clamp circuit 430, and the constraint circuit 440 that, together, help to minimize a portion of an input signal at the AC input node 202 that can be imposed on the first and second transistors 405 and 406.

For example, a maximum differential signal swing across the first and second transistors 405 and 406 can be limited by a forward drop voltage of first and second Schottky diodes 430A and 430B of the clamp circuit 430. The clamping action is facilitated, for example, by non-linear interaction of the first bridge circuit 420 with its corresponding current sources, including a first current source 403 and a second current source 404. When the first and second current sources 403 and 404 have substantially the same current magnitude, and when an input signal magnitude at the AC input node 202 is substantially equal to an input signal magnitude at the DC input node 203, then current signals in the first bridge circuit 420 can be distributed substantially equally among the diodes of the first bridge circuit 420 (e.g., including first, second, third, and fourth Schottky diodes 420A, 420B, 420C, and 420D, respectively, of the first bridge circuit 420). Under such conditions, there can be approximately zero current in diodes 430A and 430B of the clamp circuit 430. However, if an input signal at the AC input node 202 moves at least one diode forward voltage level (e.g., of one of the diodes 430A or 430B) above or below a reference signal magnitude at the DC input node 203, then the first bridge circuit 420 "opens" and current (e.g., from one or more of the first and second current sources 403 and 404) is diverted to the clamp circuit 430. In this example, the base of the first transistor 405 can be one Schottky diode forward voltage level above or below the input signal level at the DC input node 203.

In response to a large input signal swing voltage that is sufficiently large to fully commutate the first bridge circuit 420, at least a portion of the AC input signal magnitude that exceeds a magnitude of a DC input signal (i.e., at the DC input node 203) can be imposed across the commutated first bridge circuit 420. For example, the left side of the first bridge circuit 420 can correspond to an AC input signal magnitude at the AC input node 202. The right side of the first bridge circuit 420, at the compare node 401, can be clamped by the clamp circuit 430 to one diode forward voltage (e.g., about 0.3 V for a Schottky diode) above the magnitude of a reference or DC input signal at the DC input node 203.

In the example of FIG. 4, the second comparator circuit 400 includes the constraint circuit 440. The constraint circuit 440 includes a current source 407 that is coupled to a sensing switch 417. The sensing switch 417 responds to changes in a reference signal at the DC input node 203 to adjust, via first and second switches 415 and 416, a collector voltage signal magnitude for each of the first and second transistors 405 and 406.

Several advantages can be realized by incorporating the first bridge circuit 420, the clamp circuit 430, and the constraint circuit 440 in the second comparator circuit 400. For example, collector-emitter voltages of the differential pair can be reduced, such as by slaving the collector voltages of the first and second transistors 405 and 406 to the DC input node 203 using the constraint circuit 440. As a result of the collector voltage slaving, duty cycle-dependent heating can be minimized. In addition, heating of the first and second transistors 405 and 406 can be substantially insensitive to changes in a common mode voltage signal at the DC input node 203 because the collector-emitter voltages of the differential pair are referenced to the DC input node 203.

In topologies where a comparator circuit's differential pair is exposed to large voltage level swings, increased emitter capacitance can negatively influence propagation delay. However, in the example of FIG. 4 and as a result of the collector voltage slaving for the differential pair of the first and second transistors 405 and 406, the differential pair is not exposed to large voltage level swings. Thus emitter capacitances of the first and second transistors 405 and 406 can be minimized and a more consistent propagation delay characteristic can be provided.

In the example of FIG. 4, the Schottky diodes 412 and 413 at the emitters of the first and second transistors 405 and 406, respectively, are configured to help avoid base-emitter junction breakdown for the transistors under large swings on the AC input node 202. Since large swings are avoided, such as described above due to the interplay of the first bridge circuit 420 and the clamp circuit 430, the Schottky diodes 412 and 413 can optionally be removed. In an example, removing the Schottky diodes 412 and 413 can help to further reduce emitter capacitances associated with the first and second transistors 405 and 406. Removing the Schottky diodes 412 and 413 eliminates resistance characteristics associated with the diodes and, as a result, a gain characteristic of the second comparator circuit 400 can be improved.

The characteristics of the diodes 420A-420D used in the first bridge circuit 420 can be selected to balance various competing parameters. For example, physical diode size can impact diode capacitance and resistance characteristics. Forward current capability can impact diode capacitance, resistance, and can also influence sensitivity to effects of stored charges, which in turn can influence signal timing accuracy characteristics. Reverse diode breakdown can influence diode bandwidth, for example based on breakdown voltage impacts on forward resistance. These and other characteristics of the diodes 420A-420D can be tailored by adjusting various device fabrication parameters.

In an example, an improved comparator circuit withstands large voltage magnitude swings at the AC input node 202 (e.g., using diodes in the first bridge circuit 420 having high breakdown and high forward resistance characteristics), and concurrently maintains high bandwidth capabilities (e.g., using diodes in the first bridge circuit 420 having low breakdown and low forward resistance characteristics). In an example, an improved comparator can include an attenuation circuit configured to selectively attenuate a portion of an input signal at the AC input node 202. For example, the attenuation circuit can be configured to be substantially transparent for input signal levels that are near a reference signal level at the DC input node 203, and the attenuation circuit can be configured to attenuate a portion of an input signal when an input signal level exceeds some threshold amount above or below the reference signal level.

Figure 5:
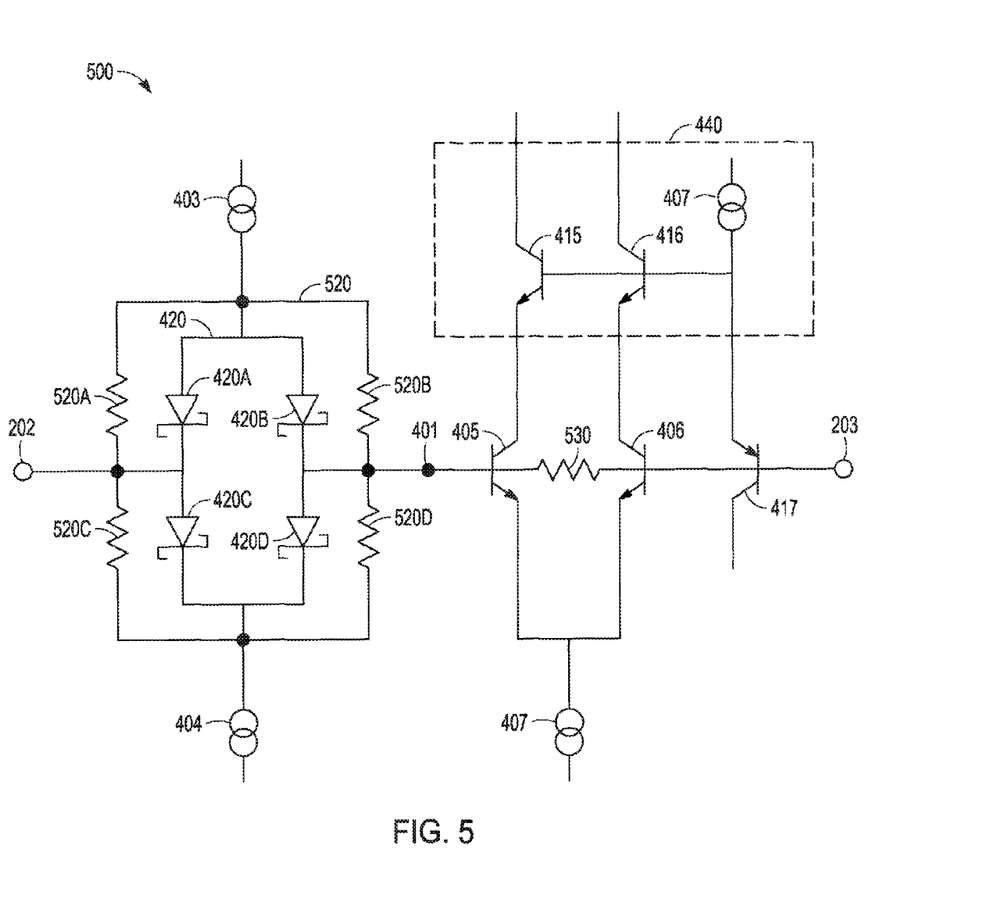
FIG. 5 illustrates generally an example of a third comparator circuit with a first attenuation circuit.

FIG. 5 illustrates generally an example of a third comparator circuit 500 with a first attenuation circuit 520 and a loading device 530. The third comparator circuit 500 includes a similar topology to that of the second comparator circuit 400, for example including the first bridge circuit 420, the first and second transistors 405 and 406, the AC input node 202 and the DC input node 203, the current sources 403, 404, and 407, the constraint circuit 440, and the sensing switch 417. In the example of FIG. 5, the clamp circuit 430 from the second comparator circuit 400 is replaced with the first loading device 530. In operation of the third comparator circuit 500, a first signal at the compare node 401 can be compared with a second signal from the DC input node 203 (e.g., using the differential pair of the first and second transistors 405 and 406) to yield an output signal from the third comparator circuit 500 that indicates a relationship between the first and second signals.

The first loading device 530 can include an impedance element or resistive device that provides a portion of a conductive path around the compare elements of the third comparator circuit 500, that is, around the first and second transistors 405 and 406. For example, the first loading device 530 can include a resistor that shunts the bases of the first and second transistors 405 and 406. Characteristics or values of the first attenuation circuit 520 and/or the first loading device 530 can be selected to provide a desired amount of input signal level attenuation at the compare node 401. In the example of FIG. 5, the Schottky diodes 412 and 413 from the second comparator circuit 400 are removed. For brevity, the earlier description and discussion of the first and second transistors 405 and 406, the constraint circuit 440, the first bridge circuit 420, and the sensing switch 417 are incorporated here by reference.

In the example of FIG. 5, the first attenuation circuit 520 is included in the third comparator circuit 500 about the first bridge circuit 420. Portions of the first attenuation circuit 520 provide a signal path that extends between the AC input node 202 and the compare node 401 of the third comparator circuit 500. That is, the first attenuation circuit 520 can provide a parallel signal path around at least a portion of the first bridge circuit 420. The first attenuation circuit 520 provides a relatively high impedance path, other than through the first bridge circuit 420, between the AC input node 202 and the compare node 401, such as when the first bridge circuit 420 is commutated. When the first bridge circuit 420 is not commutated, or is only partially commutated, all of the current from the current sources 403 and 404 passes through the diodes 420A-420D of the first bridge circuit 420, and the first bridge circuit 420 appears as a resistance (e.g., about 25 ohms) between the AC input node 202 and the compare node 401. When the first bridge circuit 420 is commutated, however, the bridge circuit acts as a substantially impassible signal wall and any changes at the AC input node 202 do not pass through.

As discussed above, an improved comparator circuit can withstand large swings in AC input signal magnitudes. Such a comparator circuit can be theoretically realized using high breakdown and high resistance diodes in the first bridge circuit 420. As additionally discussed above, an improved comparator circuit can also exhibit high signal bandwidth capabilities, such as using low breakdown and low resistance diodes in the first bridge circuit 420. Thus, these competing diode characteristics generally need to be balanced to provide a workable comparator circuit. In an example, the third comparator circuit 500 achieves these comparator circuit objectives of standing up to large input signal swings and managing high bandwidth applications simultaneously, such as using the first attenuation circuit 520 can be used to process signals at the AC input node 202.

In an example, the second and third comparator circuits 400 and 500 can respond similarly to small input signal swings at the AC input node 202. In this discussion, a "small" or low magnitude input signal swing corresponds to an input signal level for which the first bridge circuit 420 does not fully commutate. Under a "large" or high magnitude input signal swing, the input signal magnitude is sufficiently large to fully commutate the first bridge circuit 420.

In an example, under small or low magnitude input signal swing conditions, an effective impedance of the first bridge circuit 420 is determined by a resistance characteristic of one of the bridge circuit's diodes, for example, because each of the diodes 420A-420D in the first bridge circuit 420 can carry substantially equal current signals. That is, the effective impedance of the first bridge circuit 420 depends in part on the current through each of the diodes 420A-420D and on a forward resistance characteristic of each diode itself. In an example, an effective resistance magnitude provided by the first bridge circuit 420 under small input signal swings is substantially lower (e.g., about an order of magnitude or more) than a resistance of any one of the resistive elements of the first attenuation circuit 520. Thus under low or small input signal swing conditions, the first attenuation circuit 520 can be considered to be transparent, and effects of the first attenuation circuit 520 on the input signal can be neglected or disregarded. Under small input signal swing conditions, the second and third comparator circuits 400 and 500 thus exhibit a gain from the AC input node 202 to the compare node 401 of about one-to-one. As a result, both of the second and third comparator circuits 400 and 500 can provide about zero attenuation of an input signal at the AC input node 202 through the first bridge circuit 420 under small input signal swing conditions, which can enhance circuit gain and bandwidth characteristics.

As discussed above with respect to the second comparator circuit 400, a large amplitude input signal at the AC input node 202, such as sufficient to fully commutate the first bridge circuit 420, can be imposed across the commutated first bridge circuit 420. The left side of the first bridge circuit 420 is coupled to and receives the input signal from the AC input node 202. The right side of the first bridge circuit 420, at the compare node 401, is clamped to about one diode forward voltage (e.g., about 0.3 V) above an input signal at the DC input node 203. As a result, a voltage excursion on the bases of the first and second transistors 405 and 406 can be substantially limited in the second comparator circuit 400.

In the example of the third comparator circuit 500, the first attenuation circuit 520 and the first loading device 530 act together to limit a voltage excursion at the compare node 401. For example, a large amplitude input signal at the AC input node 202, such as sufficient to fully commutate the first bridge circuit 420, can be imposed across the commutated first bridge circuit 420 and the first attenuation circuit 520. The left side of the combination of the first bridge circuit 420 and the first attenuation circuit 520 can be coupled to, and can receive the input signal from, the AC input node 202. The right side of the combination of the first bridge circuit 420 and the first attenuation circuit 520, such as at the compare node 401, can be determined by a current signal that flows through the first loading device 530. The current signal that flows through the first loading device 530 can be determined at least in part by a relationship between an impedance characteristic of the first attenuation circuit 520 and the first loading device 530. As a result of the impedance relationship, a voltage imposed across the first bridge circuit 420 can be attenuated by increasing a voltage at the compare node 401. In an example, the first bridge circuit 420 can include or use low forward-voltage diode devices as each of the diodes 420A-420D. In an example, the first bridge circuit 420 can include or use an active diode bridge such as using low-loss MOSFET devices in place of the diodes.

The first attenuation circuit 520 can provide a current signal path between the AC input node 202 and the compare node 401. Various configurations of the first attenuation circuit 520 can be used. The first attenuation circuit 520 in the example of FIG. 5 includes multiple impedance elements including a first impedance element 520A, second impedance element 520B, third impedance element 520C, and fourth impedance element 520D. Each of the impedance elements of the first attenuation circuit 520 can correspond to, or shunt, one of the elements in the first bridge circuit 420. For example, the first bridge circuit 420 includes the first through fourth Schottky diodes 420A-420D. The first impedance element 520A can shunt the first Schottky diode 420A, the second impedance element 520B can shunt the second Schottky diode 420B, and so on, to provide the current signal path between the AC input node 202 and the compare node 401.

In the example of FIG. 5, the first bridge circuit 420 can include or use diodes that, under some input signal conditions, may not be suitable to withstand a full reverse voltage magnitude to which they are subjected. The first attenuation circuit 520 solves this problem by permitting a portion of an input signal (e.g., from the AC input node 202) to pass around the first bridge circuit 420 to the compare node 401. As a result, a voltage signal at the base of the first transistor 405 increases, albeit more slowly relative to the condition of having no attenuation circuit (see, e.g., the second comparator circuit 400 of FIG. 4). That is, when the first bridge circuit 420 is commutated, and the input signal at the AC input node 202 increases, a voltage signal at the compare node 401 can increase by some amount that is less than the full amount of the input signal increase.

One or more elements of the first attenuation circuit 520 can be selected to tune the attenuation characteristics of the circuit and thus determine what portion of the input signal increase is imposed at the compare node 401. In an example, the circuit can be tuned by choosing impedance values for the components of the first attenuation circuit 520 such that, at maximum excursions of the input signal, a breakdown voltage is approached for one or more of the diodes in the first bridge circuit 420.

Figure 6:
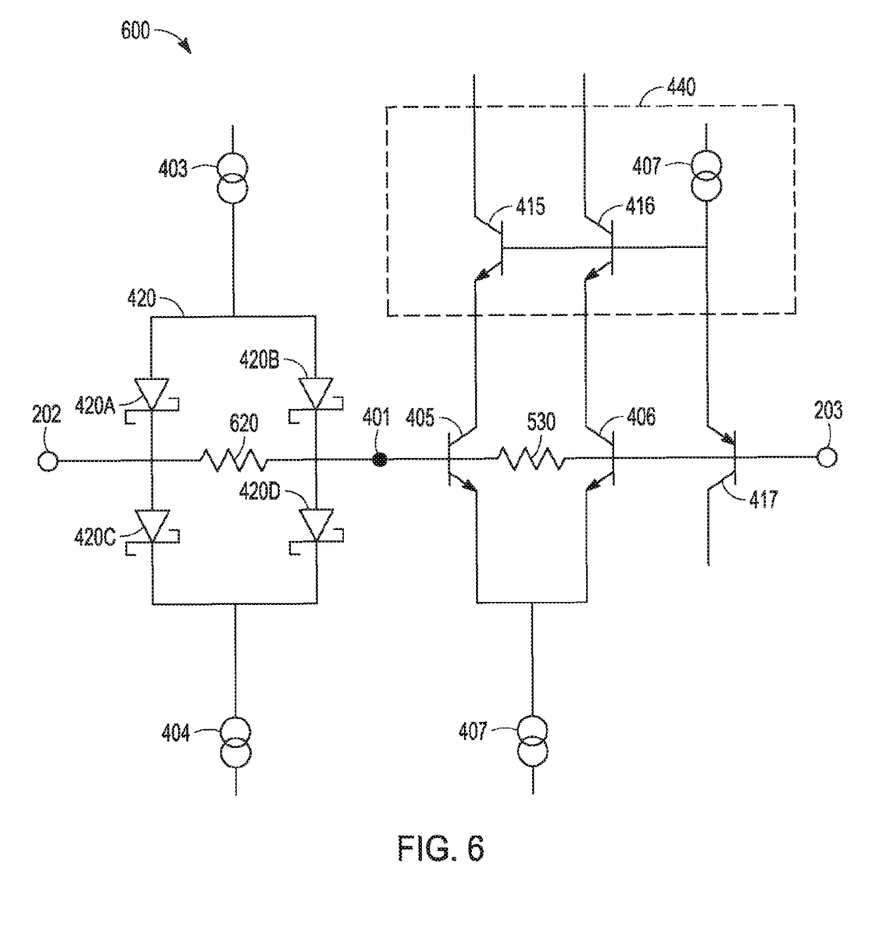
FIG. 6 illustrates generally an example of a fourth comparator circuit with a second attenuation circuit.

FIG. 6 illustrates generally an example of a fourth comparator circuit 600 with a second attenuation circuit 620. The fourth comparator circuit 600 includes a similar topology to that of the third comparator circuit 500, for example including the first bridge circuit 420, the first and second transistors 405 and 406, the AC input node 202 and the DC input node 203, the current sources 403, 404, and 407, the constraint circuit 440, the first loading device 530, and the sensing switch 417. For brevity, the earlier description and discussion of the various common elements are incorporated here by reference. In the fourth comparator circuit 600, as in the third comparator circuit 500, the first loading device 530 is coupled across the compare elements of the comparator, for example, at the bases of the first and second transistors 405 and 406 of the differential pair. That is, in the example of FIG. 6, the first loading device 530 is imposed between the compare node 401 and the DC input node 203.

In the example of the fourth comparator circuit 600, the second attenuation circuit 620 can include an impedance element or resistive device that provides a portion of a conductive path around the first bridge circuit 420. That is, the second attenuation circuit 620 can include a signal path (e.g., a resistive signal path) between the AC input node 202 and the first compare node 401. The second attenuation circuit 620 and the first loading device 530 act together to provide a portion of an input signal at the AC input node 202 to the first compare node 401. Characteristics or values of the second attenuation circuit 620 and the first loading device 530 can be selected to provide a desired amount of input signal level attenuation at the compare node 401.

In an example, the first loading device 530 and the second attenuation circuit 620 include respective passive resistive devices that form a voltage divider circuit. In an example, one or both of the first loading device 530 and the second attenuation circuit 620 include one or more active devices that can provide a static or adjustable impedance characteristic that can be used to tune a voltage signal at the compare node 401.

Figure 7:
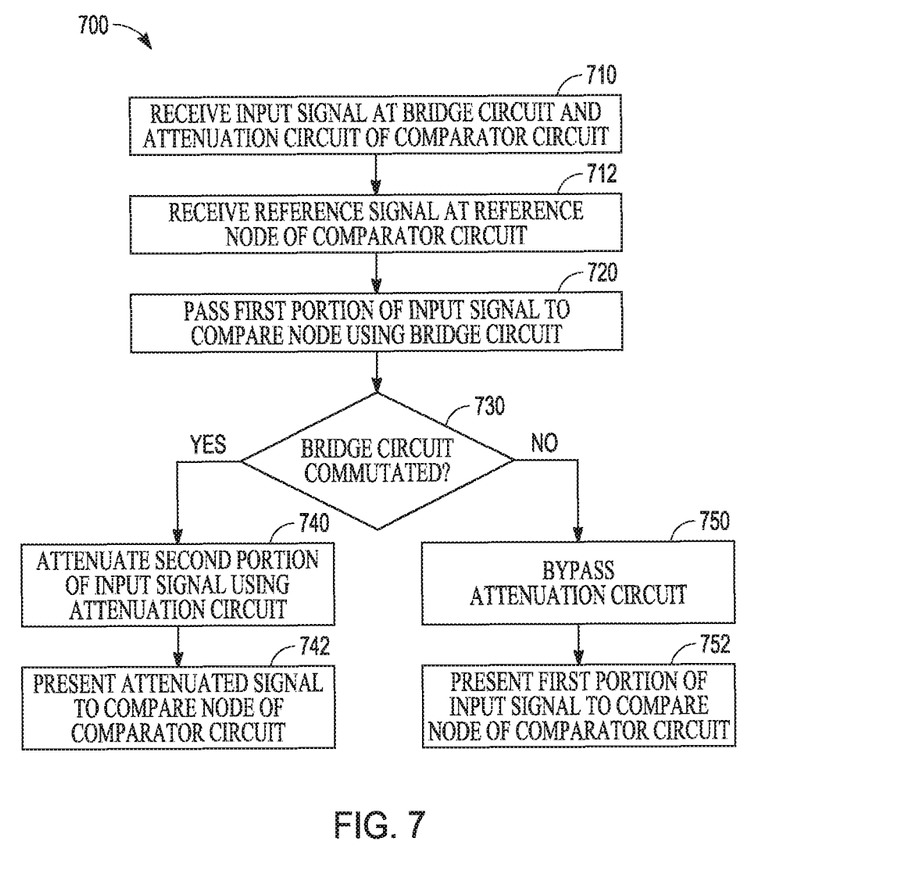
FIG. 7 illustrates generally an example of a method that includes selectively attenuating an input signal of a comparator circuit.

FIG. 7 illustrates generally an example of a method 700 that includes selectively attenuating an input signal of a comparator circuit. Some operations of the method 700 are discussed herein with reference to the third comparator circuit 500, however, other comparator circuit embodiments can be similarly used to perform the method 700.

At operation 710, the example includes receiving an input signal at a bridge circuit of a comparator circuit. For example, the input signal can be received with the AC input node 202 of the third comparator circuit 500. The AC input node 202 can be coupled to a first side of the first bridge circuit 420. In this example, the input signal can additionally be received at a first node of an attenuation circuit, such as at the first attenuation circuit 520. The first attenuation circuit 520 can shunt at least a portion of the first bridge circuit 420 to provide a resistive path between the AC input node 202 and the compare node 401, as discussed above. At operation 712, the example includes receiving a reference signal, such as at the DC input node 203. The DC input node 203 can be coupled to a second comparator input, and the compare node 401 can be coupled to a first comparator input, such as illustrated in the example of FIG. 5.

At operation 720, the example can include passing a first portion of the input signal (e.g., received at 710) from the AC input node 202 to the compare node 401. Operation 720 can include using a bridge circuit, such as a diode bridge circuit. In an example, the diode bridge circuit is biased by current sources 403 and 404, and each of the diodes in the bridge circuit can carry a substantially similar amount of current when the input signal is substantially similar in magnitude to the reference signal.

At operation 730, the example can include determining whether the bridge circuit is fully commutated based on the input signal and a relationship of the input signal to the reference signal. If the input signal magnitude is less than a specified threshold amount greater than a magnitude of the reference signal, then the bridge circuit is not fully commutated, and the bridge circuit appears as a resistance in a signal path between the AC input node 202 and the compare node 401. In an example, the attenuation circuit has a resistance characteristic that is substantially greater than a resistance characteristic of the bridge circuit when the bridge circuit is uncommutated, and thus substantially all of the input signal bypasses the attenuation circuit at operation 750 and is presented to the compare node 401 at operation 752.

If the input signal magnitude is sufficiently greater than the reference signal magnitude, then the bridge circuit can be fully commutated and the example continues at operation 740. When the bridge circuit is fully commutated, it appears in the signal path between the AC input node 202 and the compare node 401 as a resistance that is greater than a resistance characteristic of the attenuation circuit. As a result, at operation 740, a portion of the input signal that is not passed using the bridge circuit can instead be attenuated using an attenuation circuit, such as using the attenuation circuit 520. The attenuated portion of the input signal can be presented from the attenuation circuit to the compare node 401 at operation 742. The first portion of the input signal from the bridge circuit and the attenuated portion of the input signal from the attenuation circuit can thus be presented to the compare node 401 and compared to the reference signal from the DC input node 202 using a compare element such as a differential pair of transistors.

The comparator circuits discussed herein, such as the third and fourth comparator circuits 500 and 600, include attenuation circuits that help to maximize an input signal range tolerance for the comparator circuits. For example, in both of the third and fourth comparator circuits 500 and 600, one or more components of the first and second attenuation circuits 520 and 620, and/or the first loading device 530, can be selected or adjusted to provide scalable attenuation of an input signal at the compare node 401. That is, an amount of attenuation of an input signal can be determined based on the values of the components of the various attenuation circuits and devices included in the comparator circuits, for example, to reduce reverse voltage stresses on the first bridge circuit 420, and to enhance gain and bandwidth performance criteria of the comparator circuits.

VARIOUS NOTES & EXAMPLES

Example 1 can include or use subject matter such as an apparatus, device, or machine such as can include or use a system comprising an input node configured to receive an input signal, a reference node configured to receive a reference signal, and a comparator circuit, including first and second comparator inputs and a comparator output, the second comparator input coupled to the reference node. Example 1 can further include a conditioning circuit, coupled to the input node and to the first comparator input, wherein the conditioning circuit passes the input signal from the input node to the first comparator input when a magnitude of the input signal is substantially the same as a magnitude of the reference signal, and wherein the conditioning circuit passes an attenuated portion of the input signal from the input node to the first comparator input when the magnitude of the input signal is substantially different than the magnitude of the reference signal. Example 1 can further include an attenuation circuit, including a first signal path parallel to the conditioning circuit and between the input node and the first comparator input, wherein the first signal path includes a first signal attenuator that is configured to present an attenuated portion of the input signal to the first comparator input, and a second signal path between the first and second comparator inputs, wherein the second signal path includes an electrical load to the conditioning circuit and to the first signal attenuator.

Example 2 can include, or can optionally be combined with the subject matter of Example 1, to optionally include wherein the conditioning circuit includes a diode bridge circuit having a first side coupled to the input node and a second side coupled to the first comparator input.

Example 3 can include, or can optionally be combined with the subject matter of Example 2, to optionally include wherein when the diode bridge circuit is uncommutated, a resistance characteristic of the diode bridge is substantially less than a resistance characteristic of the first signal attenuator in the first signal path.

Example 4 can include, or can optionally be combined with the subject matter of one or any combination of Examples 2 or 3 to optionally include wherein when the diode bridge circuit is commutated, a resistance characteristic of the diode bridge is substantially greater than a resistance characteristic of the first signal attenuator in the first signal path.

Example 5 can include, or can optionally be combined with the subject matter of one or any combination of Examples 2 through 4 to optionally include wherein the first signal attenuator includes a resistor network that includes resistive elements that each respectively corresponds to a different diode in the diode bridge circuit.

Example 6 can include, or can optionally be combined with the subject matter of one or any combination of Examples 2 through 5 to optionally include wherein when the diode bridge circuit is commutated, a difference between the magnitude of the input signal and a magnitude of a signal at the first comparator input is less than a breakdown voltage of one or more of the diodes in the diode bridge circuit.

Example 7 can include, or can optionally be combined with the subject matter of one or any combination of Examples 2 through 6 to optionally include wherein the diode bridge circuit comprises four Schottky diodes.

Example 8 can include, or can optionally be combined with the subject matter of one or any combination of Examples 1 through 7 to optionally include wherein the attenuation circuit includes a first resistor as the first signal attenuator and a second resistor as the electrical load, and wherein the first and second resistors are coupled to the first comparator input, and wherein the first and second resistors form a voltage divider circuit that provides the attenuated portion of the input signal to the first comparator input.

Example 9 can include, or can optionally be combined with the subject matter of one or any combination of Examples 1 through 8 to optionally include wherein the electrical load includes one or more diode devices.

Example 10 can include, or can optionally be combined with the subject matter of one or any combination of Examples 1 through 9 to optionally include wherein the input node is configured to receive an input signal having an AC signal magnitude that exceeds a breakdown voltage characteristic of the conditioning circuit.

Example 11 can include or use subject matter such as an apparatus, device, or machine such as can include or use a comparator system. In Example 11, the comparator system can include an input node configured to receive an input signal, a reference node configured to receive a reference signal, and a comparator circuit, including first and second comparator inputs and a comparator output, the second comparator input coupled to the reference node. Example 11 can include a diode bridge circuit coupled to the input node and to the first comparator input, wherein when the diode bridge circuit is commutated, the diode bridge circuit inhibits a first portion of the input signal from passing to the first comparator input, and when the diode bridge circuit is uncommutated, the diode bridge circuit inhibits a lesser second portion of the input signal from passing to the first comparator input. Example 11 can further include a resistive shunt circuit that shunts the diode bridge circuit, the resistive shunt circuit including a first side coupled to the input node and including a second side coupled to the first comparator input, and a resistive load coupled between the first and second comparator inputs, the resistive load configured to electrically load the diode bridge circuit and the resistive shunt circuit.

Example 12 can include, or can optionally be combined with the subject matter of Example 11, to optionally include wherein the resistive shunt circuit includes a resistive bridge circuit having first and opposite second sides that are coupled to the input node and the first comparator input, respectively.

Example 13 can include, or can optionally be combined with the subject matter of Example 12, to optionally include wherein the diode bridge circuit includes four Schottky diodes, wherein the resistive bridge circuit includes four passive resistor devices, and wherein each one of the four passive resistor devices shunts a respective one of the Schottky diodes in the diode bridge circuit.

Example 14 can include, or can optionally be combined with the subject matter of one or any combination of Examples 11 through 13 to optionally include wherein when the diode bridge circuit is uncommutated, a resistance magnitude characteristic of the resistive bridge circuit exceeds a resistance magnitude characteristic of the diode bridge circuit.

Example 15 can include, or can optionally be combined with the subject matter of one or any combination of Examples 11 through 14 to optionally include wherein the resistive bridge circuit and resistive load are coupled at the first comparator input, and wherein the resistive bridge circuit and the resistive load provide an attenuated portion of the input signal at the first comparator input.

Example 16 can include or use subject matter such as a method, a means for performing acts, or a device readable medium including instructions that, when performed by the device, can cause the device to perform acts, such as can include receiving an AC signal at an input node of a comparator system, using a diode bridge circuit, conditioning the AC signal and presenting a resulting conditioned signal to a first comparator input of a comparator circuit, the comparator circuit configured to update a comparator output state based on a relationship between the resulting conditioned signal and a reference signal at a second comparator input of the comparator circuit, and when the diode bridge circuit is commutated based on the received AC signal, attenuating a portion of the received AC signal using an attenuation circuit and presenting the attenuated portion of the received AC signal at the first comparator input of the comparator circuit.

Example 17 can include, or can optionally be combined with the subject matter of Example 16, to optionally include wherein the attenuating the portion of the received AC signal includes using a voltage divider that includes a first impedance that shunts the diode bridge circuit and a second impedance that shunts the first and second comparator inputs of the comparator circuit.

Example 18 can include, or can optionally be combined with the subject matter of Example 17, to optionally include selecting an impedance characteristic of the first and second impedances based on a specified maximum voltage magnitude characteristic of the received AC signal to avoid exceeding a breakdown voltage of one or more diode devices in the diode bridge circuit.

Example 19 can include, or can optionally be combined with the subject matter of one or any combination of Examples 16 through 18 to optionally include wherein the attenuating the portion of the received AC signal includes using a resistive bridge circuit that shunts the diode bridge circuit, the resistive bridge circuit including discrete resistive devices that respectively correspond to each diode in the diode bridge circuit.

Example 20 can include, or can optionally be combined with the subject matter of one or any combination of Examples 16 through 19 to optionally include wherein when the diode bridge circuit is uncommutated based on the received AC signal, using the diode bridge circuit to present substantially all of the AC signal as the resulting conditioned signal at the first comparator input.

Each of these non-limiting examples can stand on its own, or can be combined in various permutations or combinations with one or more of the other examples.

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A system comprising:
an input node configured to receive an input signal;
a reference node configured to receive a reference signal;
a comparator circuit, including first and second comparator inputs and a comparator output, the second comparator input coupled to the reference node;
a conditioning circuit, coupled to the input node and to the first comparator input, wherein the conditioning circuit passes the input signal from the input node to the first comparator input when a magnitude of the input signal is substantially the same as a magnitude of the reference signal, and wherein the conditioning circuit passes an attenuated portion of the input signal from the input node to the first comparator input when the magnitude of the input signal is substantially different than the magnitude of the reference signal; and
an attenuation circuit, including:
a first signal attenuator coupled to the input node and the first comparator input, wherein the first signal attenuator is configured to present an attenuated portion of the input signal to the first comparator input; and
an electrical load circuit coupled to the first and second comparator inputs, wherein the electrical load circuit provides an electrical load to the conditioning circuit and to the first signal attenuator.

2. The system of claim 1, wherein the conditioning circuit includes a diode bridge circuit having a first side coupled to the input node and a second side coupled to the first comparator input.

3. The system of claim 2, wherein when the diode bridge circuit is uncommutated, a resistance characteristic of the diode bridge is substantially less than a resistance characteristic of the first signal attenuator.

4. The system of claim 2, wherein when the diode bridge circuit is commutated, a resistance characteristic of the diode bridge is substantially greater than a resistance characteristic of the first signal attenuator.

5. The system of claim 2, wherein the first signal attenuator includes a resistor network that includes resistive elements that each respectively corresponds to a different diode in the diode bridge circuit.

6. The system of claim 2, wherein when the diode bridge circuit is commutated, a difference between the magnitude of the input signal and a magnitude of a signal at the first comparator input is less than a breakdown voltage of one or more of the diodes in the diode bridge circuit.

7. The system of claim 2, wherein the diode bridge circuit comprises four Schottky diodes.

8. The system of claim 1, wherein the attenuation circuit includes a first resistor as the first signal attenuator and a second resistor as the electrical load, and wherein the first and second resistors are coupled to the first comparator input, and wherein the first and second resistors form a voltage divider circuit that provides the attenuated portion of the input signal to the first comparator input.

9. The system of claim 1, wherein the electrical load includes one or more diode devices.

10. The system of claim 1, wherein the input node is configured to receive an input signal having an AC signal magnitude that exceeds a breakdown voltage characteristic of the conditioning circuit.

11. A comparator system comprising:
an input node configured to receive an input signal;
a reference node configured to receive a reference signal;
a comparator circuit, including first and second comparator inputs and a comparator output, the second comparator input coupled to the reference node;
a diode bridge circuit coupled to the input node and to the first comparator input, wherein when the diode bridge circuit is commutated, the diode bridge circuit inhibits a first portion of the input signal from passing to the first comparator input, and when the diode bridge circuit is uncommutated, the diode bridge circuit inhibits a lesser second portion of the input signal from passing to the first comparator input;
a resistive shunt circuit that shunts the diode bridge circuit, the resistive shunt circuit including a first side coupled to the input node and including a second side coupled to the first comparator input; and
a resistive load coupled between the first and second comparator inputs, the resistive load configured to electrically load the diode bridge circuit and the resistive shunt circuit.

12. The comparator system of claim 11, wherein the resistive shunt circuit includes a resistive bridge circuit having first and opposite second sides that are coupled to the input node and the first comparator input, respectively.

13. The comparator system of claim 12, wherein the diode bridge circuit includes four Schottky diodes, wherein the resistive bridge circuit includes four passive resistor devices, and wherein each one of the four passive resistor devices shunts a respective one of the Schottky diodes in the diode bridge circuit.

14. The comparator system of claim 11, wherein when the diode bridge circuit is uncommutated, a resistance magnitude characteristic of the resistive bridge circuit exceeds a resistance magnitude characteristic of the diode bridge circuit.

15. The comparator system of claim 11, wherein the resistive bridge circuit and resistive load are coupled at the first comparator input, and wherein the resistive bridge circuit and the resistive load provide an attenuated portion of the input signal at the first comparator input.

16. A method comprising:
receiving an AC signal at an input node of a comparator system, the comparator system including the input node and a different reference node;
using a diode bridge circuit, conditioning the AC signal and presenting a resulting conditioned signal to a first comparator input of a comparator circuit, the comparator circuit configured to update a comparator output state based on a relationship between the resulting conditioned signal and a reference signal at the reference node of the comparator circuit; and
when the diode bridge circuit is commutated based on the received AC signal, attenuating a portion of the received AC signal using an attenuation circuit that shunts the input node of the comparator system and the first comparator input of the comparator circuit, and presenting the attenuated portion of the received AC signal from the attenuation circuit to the first comparator input of the comparator circuit.

17. The method of claim 16, wherein the attenuating the portion of the received AC signal includes using a voltage divider that includes a first impedance that shunts the diode bridge circuit and a second impedance that shunts the first and second comparator inputs of the comparator circuit.

18. The method of claim 17, further comprising selecting an impedance characteristic of the first and second impedances based on a specified maximum voltage magnitude characteristic of the received AC signal to avoid exceeding a breakdown voltage of one or more diode devices in the diode bridge circuit.

19. The method of claim 16, wherein the attenuating the portion of the received AC signal includes using a resistive bridge circuit that shunts the diode bridge circuit, the resistive bridge circuit including discrete resistive devices that respectively correspond to each diode in the diode bridge circuit.

20. The method of claim 16, wherein when the diode bridge circuit is uncommutated based on the received AC signal, using the diode bridge circuit to present substantially all of the AC signal as the resulting conditioned signal at the first comparator input.

* * * * *

UNITED STATES PATENT AND TRADEMARK OFFICE
CERTIFICATE OF CORRECTION

| | | |
|---|---|---|
| PATENT NO. | : 9,813,050 B1 | Page 1 of 1 |
| APPLICATION NO. | : 15/097954 | |
| DATED | : November 7, 2017 | |
| INVENTOR(S) | : Christopher C. McQuilkin | |

It is certified that error appears in the above-identified patent and that said Letters Patent is hereby corrected as shown below:

On the Title Page

In item (22), in "Filed", in Column 1, Line 1, after "2016", insert:
--¶(65) Prior Publication Data
US 2017/0302257 A1 Oct. 19, 2017--

Signed and Sealed this
Twenty-eighth Day of May, 2019

Andrei Iancu
*Director of the United States Patent and Trademark Office*